(12) United States Patent
Cho et al.

(10) Patent No.: US 10,830,968 B2
(45) Date of Patent: Nov. 10, 2020

(54) PHOTODETECTOR STRUCTURE

(71) Applicant: Samsung Electronics Co., Ltd., Suwon-si (KR)

(72) Inventors: Keun Yeong Cho, Suwon-si (KR); Ho-Chul Ji, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/211,344

(22) Filed: Dec. 6, 2018

(65) Prior Publication Data

US 2019/0319139 A1 Oct. 17, 2019

(30) Foreign Application Priority Data

Apr. 12, 2018 (KR) .................. 10-2018-0042483

(51) Int. Cl.
*G02B 6/42* (2006.01)
*H01L 31/0232* (2014.01)
*G02B 6/12* (2006.01)
*H01L 31/0216* (2014.01)

(52) U.S. Cl.
CPC .......... *G02B 6/42* (2013.01); *G02B 6/12004* (2013.01); *H01L 31/02327* (2013.01); *H01L 31/02161* (2013.01)

(58) Field of Classification Search
CPC .......... H01L 31/02327; H01L 31/1808; H01L 31/105; H01L 31/0232; G02B 6/42
See application file for complete search history.

(56) References Cited

U.S. PATENT DOCUMENTS

| | | | |
|---|---|---|---|
| 5,701,379 A * | 12/1997 | Takeuchi | G02B 6/12004 257/432 |
| 6,819,839 B2 * | 11/2004 | Zheng | G02B 6/42 257/431 |
| 6,897,498 B2 | 5/2005 | Gothoskar et al. | |
| 6,991,892 B2 * | 1/2006 | Block | G02B 6/12004 257/432 |
| 7,120,350 B2 | 10/2006 | Block et al. | |
| 7,266,263 B2 | 9/2007 | Ahn et al. | |
| 7,613,369 B2 | 11/2009 | Witzens et al. | |
| 8,717,740 B2 | 5/2014 | Ashino et al. | |
| 8,866,187 B2 | 10/2014 | Na et al. | |
| 8,995,805 B2 | 3/2015 | Meade | |
| 9,229,164 B2 | 1/2016 | Assefa et al. | |
| 9,362,428 B2 * | 6/2016 | Chen | H01L 31/0232 |

(Continued)

FOREIGN PATENT DOCUMENTS

| | | |
|---|---|---|
| JP | 2006-522465 A | 9/2006 |
| KR | 2012-0011117 A | 2/2012 |
| WO | WO 2004/088723 A2 | 10/2004 |

*Primary Examiner* — Daniel Petkovsek
(74) *Attorney, Agent, or Firm* — Lee IP Law, P.C.

(57) ABSTRACT

A photodetector structure includes a substrate including a semiconductor film, a light absorption layer which is in contact with the semiconductor film and includes germanium (Ge), on the substrate, a first coating layer which wraps at least a part of a side surface of the light absorption layer, on the substrate, and an optical waveguide which is in contact with the light absorption layer and includes silicon nitride (SiN), on the first coating layer, wherein a lower surface of the optical waveguide is higher than a lower surface of the light absorption layer.

16 Claims, 16 Drawing Sheets

(56) References Cited

U.S. PATENT DOCUMENTS

| | | |
|---|---|---|
| 9,746,607 B2 | 8/2017 | Collins et al. |
| 10,331,007 B2 * | 6/2019 | Yoneda .................... G02F 1/21 |
| 10,340,399 B2 * | 7/2019 | Okumura .............. H01L 31/028 |
| 2003/0161571 A1 * | 8/2003 | Davids ................. G02B 6/4214 |
| | | 385/14 |
| 2004/0188794 A1 * | 9/2004 | Gothoskar ............. B82Y 20/00 |
| | | 257/459 |

* cited by examiner

PHOTODETECTOR STRUCTURE

CROSS-REFERENCE TO RELATED APPLICATION

Korean Patent Application No. 10-2018-0042483, filed on Apr. 12, 2018, in the Korean Intellectual Property Office, and entitled: "Photodetector Structure," is incorporated by reference herein in its entirety.

BACKGROUND

1. Field

The present disclosure relates to a photodetector structure. More specifically, the present disclosure relates to a photodetector structure including a germanium (Ge) light absorption layer.

2. Description of the Related Art

A photodetector (PD) is a device that detects an optical signal (light intensity) to generate an electrical signal. In order to achieve a photodetector which operates in a specific wavelength band, a method of crystal-growing germanium (Ge) above a silicon (Si) substrate may be used.

SUMMARY

According to aspects of the present disclosure, there is provided a photodetector structure including a substrate having a semiconductor film, a light absorption layer which is in contact with the semiconductor film and includes germanium (Ge), on the substrate, a first coating layer which wraps at least a part of a side surface of the light absorption layer, on the substrate, and an optical waveguide which is in contact with the light absorption layer and includes silicon nitride (SiN), on the first coating layer, wherein a lower surface of the optical waveguide is higher than a lower surface of the light absorption layer.

According to aspects of the present disclosure, there is also provided a photodetector structure including a substrate having a semiconductor film, a light absorption layer which is in contact with the semiconductor film and includes germanium (Ge), on the substrate, a coating layer on the substrate and the light absorption layer, and an optical waveguide which penetrates the coating layer and is in contact with the light absorption layer, wherein the optical waveguide is spaced apart from the substrate by the coating layer, and a lower surface of the coating layer is higher than or the same as a lower surface of the light absorption layer.

According to aspects of the present disclosure, there is also provided a photodetector structure including a substrate having a semiconductor film, a light absorption layer which is in contact with the semiconductor film and includes germanium (Ge), on the substrate, a coating layer on the substrate and the light absorption layer, and an optical waveguide which penetrates the coating layer and is in contact with an upper surface of the light absorption layer, wherein the optical waveguide is spaced apart from the substrate by the coating layer.

According to aspects of the present disclosure, there is also provided a photodetector structure including a substrate having a semiconductor film, a light absorption layer including germanium (Ge) on an uppermost surface of the semiconductor film, a first coating layer which covers a part of a side surface of the light absorption layer, on the substrate, and an optical waveguide which is in contact with the other part of the side surface of the light absorption layer and includes silicon nitride (SiN), on the first coating layer, wherein a lower surface of the optical waveguide is higher than a lower surface of the light absorption layer.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, a photodetector structure according to some embodiments will be described with reference to FIGS. 1 to 16.

Figure 1:
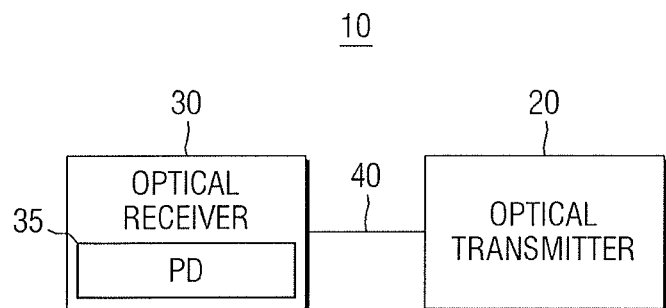
FIG. 1 illustrates a schematic block diagram of an optical communication system according to some embodiments.

FIG. 1 is a schematic block diagram of an optical communication system according to some embodiments.

Referring to FIG. 1, an optical communication system 10 according to some embodiments may include an optical transmitter 20, a channel 40, and an optical receiver 30.

The optical transmitter 20 converts an electrical signal into an optical signal. The channel 40 may transmit the converted optical signal from the optical transmitter 20 to the optical receiver 30. The channel 40 may include, e.g., an optical fiber.

The optical receiver 30 converts the transmitted optical signal into an electrical signal again. For example, the optical receiver 30 may include a photodetector (PD) structure 35. The photodetector structure 35 detects the transmitted optical signal and converts it into the electrical signal.

Figure 2:
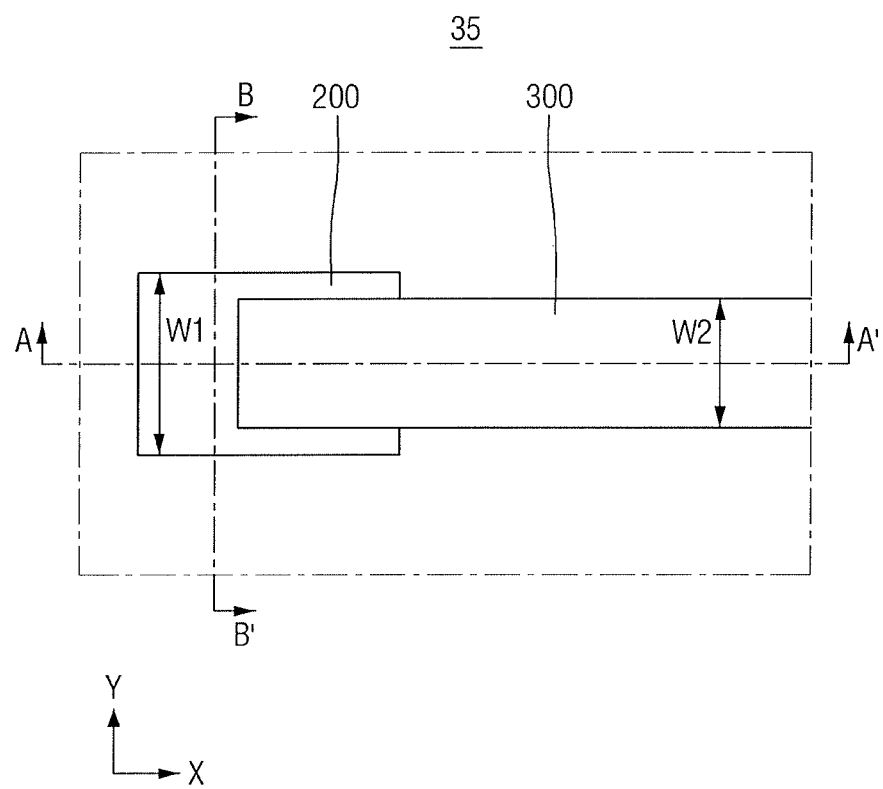
FIG. 2 illustrates a layout diagram of a photodetector structure according to some embodiments.
Figure 3:
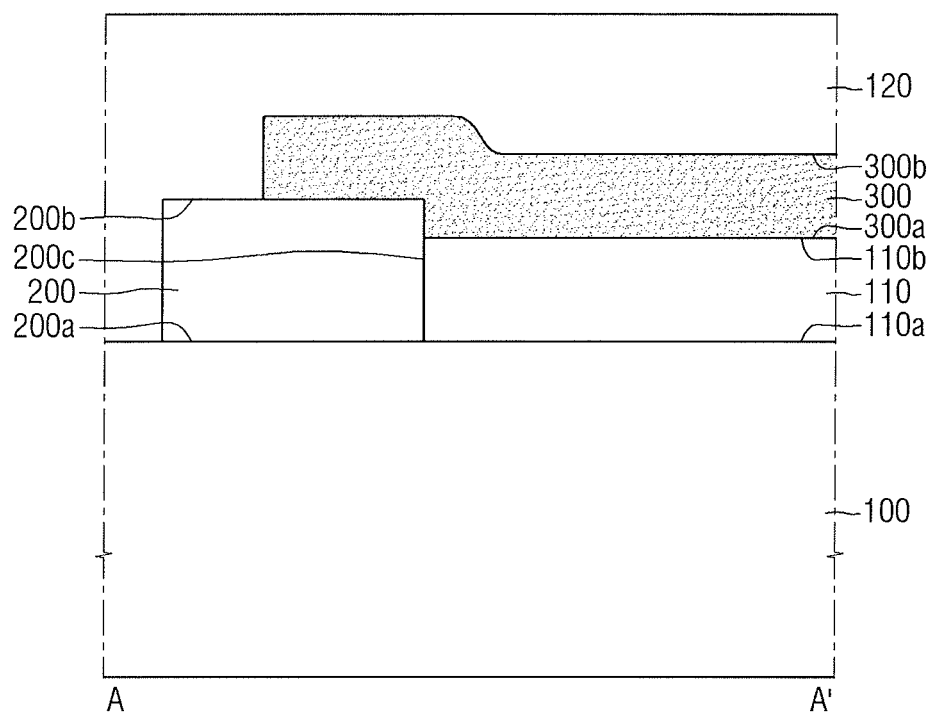
FIG. 3 illustrates a cross-sectional view along line A-A' of FIG. 2.
Figure 4:
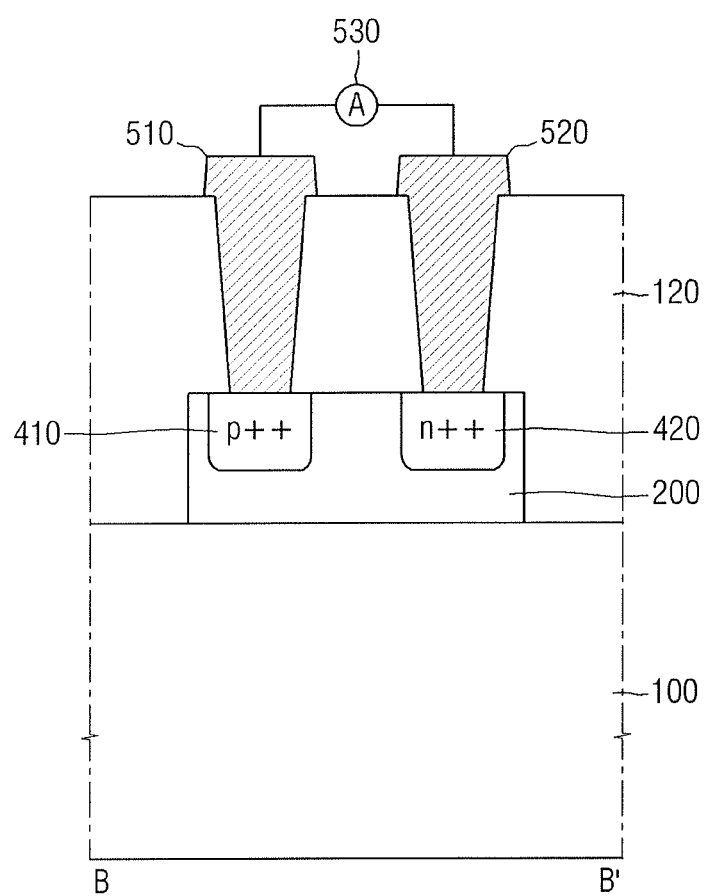
FIGS. 4 and 5 illustrate various cross-sectional views along line B-B' of FIG. 2.
Figure 5:
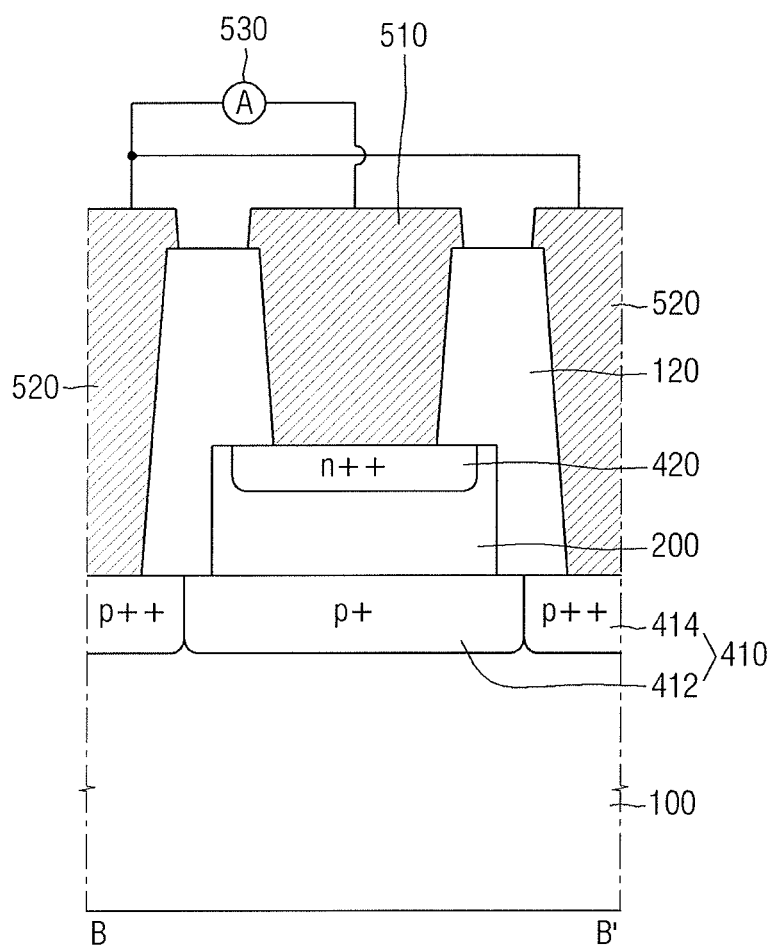

FIG. 2 is a top view layout diagram of the photodetector structure 35 according to some embodiments. FIG. 3 is a cross-sectional view along line A-A' of FIG. 2, and FIGS. 4 and 5 are various cross-sectional views along line B-B' of FIG. 2. For convenience of description, a first impurity region 410, a second impurity region 420, a first electrode 510, and a second electrode 520 are not illustrated in FIGS. 2 and 3.

Referring to FIGS. 2 to 5, the photodetector structure 35 according to some embodiments may include a substrate 100, a light absorption layer 200, a first coating layer 110, an optical waveguide 300, a second coating layer 120, a first impurity region 410, a second impurity region 420, a first electrode 510, and a second electrode 520.

The substrate 100 may include a semiconductor film. For example, the substrate 100 may be a silicon substrate, or may include other materials, e.g., silicon germanium, indium antimonide, lead tellurium compound, indium arsenide, indium phosphide, gallium arsenide or gallium antimonide. In another example, the substrate 100 may have an epitaxial layer formed on a base substrate. For convenience of description, the semiconductor film will be described as a silicon film below.

The light absorption layer 200 may be formed on the substrate 100. In addition, the light absorption layer 200 may be in contact with the semiconductor film of the substrate 100. For example, the light absorption layer 200 may be formed by crystal growth (e.g., epi-growth) from an uppermost surface of the semiconductor film of the substrate 100.

The light absorption layer 200 may include germanium (Ge). In some embodiments, the light absorption layer 200 may include, but is not limited to, a low-temperature deposited germanium layer and a high-temperature deposited germanium layer. For example, the light absorption layer 200 may be formed of a single germanium layer. In another example, the light absorption layer 200 may be formed in the form of an alloy in which silicon (Si) and germanium (Ge) are mixed at an appropriate ratio. For example, light absorption layer 200 may include single crystalline germanium, but is not limited thereto, and may include poly crystalline germanium.

The first coating layer 110 may be formed on the substrate 100. In addition, the first coating layer 110 may cover at least a part of a side surface 200c of the light absorption layer 200. For example, as illustrated in FIG. 3, the first coating layer 110 may be formed on the upper surface of the substrate 100 and the side surface of the light absorption layer 200.

In some embodiments, the light absorption layer 200 and the first coating layer 110 may be formed on the uppermost surface of the substrate 100. For example, the light absorption layer 200 and the first coating layer 110 may be in, e.g., direct, contact with the uppermost surface of the semiconductor film of the substrate 100. Thus, a lower surface 110a of the first coating layer 110 may be arranged at substantially the same height as a lower surface 200a of the light absorption layer 200, e.g., the lower surfaces 110a and 200a of the first coating layer 110 and the light absorption layer 200 may be substantially level with each other.

The optical waveguide 300 may have a shape extending long on the first coating layer 110, e.g., the optical waveguide 300 may have a linear shape having a longitudinal direction extending along a first direction X (FIG. 2). In addition, the optical waveguide 300 may be in contact with the light absorption layer 200. For example, the optical waveguide 300 may extend on an upper surface 110b of the first coating layer 110 in the first direction X parallel to the upper surface of the substrate 100, and may be in contact with the light absorption layer 200. In some embodiments, the optical waveguide 300 may extend, e.g., continuously, along the profiles of an upper surface 200b of the light absorption layer 200 and the upper surface 110b of the first coating layer 110.

A lower surface 300a of the optical waveguide 300 may be higher than the lower surface 200a of the light absorption layer 200. For example, as illustrated in FIG. 3, the light absorption layer 200 and the first coating layer 110 are formed on the upper surface of the substrate 100, and the optical waveguide 300 may be formed on the upper surface 110b of the first coating layer 110. Thus, the lower surface 300a of the optical waveguide 300 may be disposed to be higher than the lower surface 200a of the light absorption layer 200 relative to the substrate 100. In FIG. 3, the lower surface 300a of the optical waveguide 300 is illustrated as being lower than the upper surface 200b of the light absorption layer 200, but the present disclosure is not limited thereto. For example, the upper surface 110b of the first coating layer 110 or the lower surface 300a of the optical waveguide 300 may be higher than the upper surface 200b of the light absorption layer 200.

In some embodiments, the optical waveguide 300 may be in contact with at least a part of the upper surface 200b of the light absorption layer 200. Therefore, the optical waveguide 300 may form an evanescent coupling, e.g., via only partial contact, with the light absorption layer 200. In FIG. 3, the optical waveguide 300 is illustrated as being in contact with a part of the upper surface 200b of the light absorption layer 200, but the present disclosure is not limited thereto. For example, in some embodiments, the optical waveguide 300 may completely cover the upper surface 200b of the light absorption layer 200.

In some embodiments, the optical waveguide 300 may be in contact with a part of the side surface of the light absorption layer 200, i.e., with a surface connecting the lower and upper surfaces 200a and 200b of light absorption layer 200. For example, as illustrated in FIG. 3, the first coating layer 110 may surround, e.g., wrap around, a part of the side surface of the light absorption layer 200, e.g., the first coating layer 110 may contact and overlap only part of the side surface of the light absorption layer 200. Since the optical waveguide 300 is formed on the first coating layer 110, the optical waveguide 300 may be in contact with another part of the side surface of the light absorption layer 200, e.g., the optical waveguide 300 may be in contact with an upper portion of the side surface of the light absorption layer 200 above the first coating layer 110. Accordingly, the optical waveguide 300 may also form a butt coupling with the light absorption layer 200, e.g., the optical waveguide 300 may continuously extend along the upper portion of the side surface of the light absorption layer 200 over a corner of the light absorption layer 200 to extend at least partially on the upper surface 200b of the light absorption layer 200.

In FIG. 2, the width of the light absorption layer 200 is illustrated as being wider than the width of the optical waveguide 300. Here, the "width" means the width in a second direction Y which intersects with the first direction X. For example, as illustrated, a first width W1 of the light absorption layer 200 may be wider than a second width W2 of the optical waveguide 300. However, this is only for convenience of explanation, and the present disclosure is not limited thereto. For example, the first width W1 of the light absorption layer 200 may be substantially the same as or narrower than the second width W2 of the optical waveguide 300.

The optical waveguide 300 may include a material having a higher refractive index than the first coating layer 110 and the second coating layer 120. In addition, the optical waveguide 300 may include various materials having a lower optical loss rate than the silicon optical waveguide. In some embodiments, the optical waveguide 300 may include, but is not limited to, silicon nitride (SiN).

The second coating layer 120 may be formed on the substrate 100. In addition, the second coating layer 120 may cover the light absorption layer 200, the first coating layer 110, and the optical waveguide 300. Therefore, the optical waveguide 300 may be surrounded by a coating formed by the first coating layer 110 and the second coating layer 120. Further, the optical waveguide 300 may penetrate through the coating formed by the first coating layer 110 and the second coating layer 120 to make contact with the light absorption layer 200.

The first coating layer 110 and the second coating layer 120 may include a material having a refractive index lower than that of the optical waveguide 300. Therefore, the optical signal transferred through the optical waveguide 300 may be totally reflected and transmitted. For example, the optical signal may be transferred in the first direction X via the optical waveguide 300 and provided to the light absorption layer 200.

For example, the first coating layer 110 and the second coating layer 120 may include, but is not limited to, silicon oxide. In addition, the first coating layer 110 and the second coating layer 120 may be formed by, e.g., a vapor deposition process, but is not limited thereto. The first coating layer 110 and the second coating layer 120 may include the same material or different materials.

The first impurity region 410 and the second impurity region 420 may include impurities of different conductivity types. For example, the first impurity region 410 may include an impurity of a first conductivity type, and the second impurity region 420 may include an impurity of a second conductivity type different from the first conductivity type. Hereinafter, for convenience of explanation, description will be given of a case where the first impurity region 410 includes a p-type impurity and the second impurity region 420 includes an n-type impurity. However, the present disclosure is not limited thereto, and the first impurity region 410 may include an n-type impurity and the second impurity region 420 may include a p-type impurity.

In some embodiments, the first impurity region 410 and the second impurity region 420 may be formed in the light absorption layer 200, as illustrated in FIGS. 2 and 4. For example, an ion implantation process may be performed on the light absorption layer 200 to form the first impurity region 410 and the second impurity region 420 including impurities in the light absorption layer 200.

Although the first impurity region 410 and the second impurity region 420 are illustrated as being formed in the upper part of the light absorption layer 200, respectively, the present disclosure is not limited thereto. For example, the first impurity region 410 and the second impurity region 420 may be formed on the side parts of the light absorption layer 200, respectively.

In FIGS. 2 and 4, the first impurity region 410 and the second impurity region 420 are illustrated as being arranged to be adjacent to each other in the second direction Y, but the present disclosure is not limited thereto. For example, the first impurity region 410 and the second impurity region 420 may be arranged to be adjacent to each other along the first direction X.

In some embodiments, as illustrated in FIGS. 2 and 5, the first impurity region 410 may be formed in the substrate 100 and the second impurity region 420 may be formed in the light absorption layer 200. For example, a first impurity region 410 containing a p-type impurity may be formed in the substrate 100 by performing the ion implantation process on the substrate 100. Subsequently, a second impurity region 420 containing n-type impurities may be formed by performing the ion implantation process on the light absorption layer 200 formed on the substrate 100.

In some embodiments, the first impurity region 410 may include a first well 412 and a second well 414. The impurity concentration of the second well 414 may be relatively higher than the impurity concentration of the first well 412. For example, the second well 414 may be doped with a high concentration p-type impurity and the first well 412 may be doped with a low concentration p-type impurity.

The first electrode 510 and the second electrode 520 may be connected to the first impurity region 410 and the second impurity region 420, respectively. For example, as illustrated in FIGS. 4 and 5, the first electrode 510 may be connected to the first impurity region 410 through the second coating layer 120. Similarly, the second electrode 520 may be connected to the second impurity region 420 through the second coating layer 120.

The first electrode 510 and the second electrode 520 may include any suitable electrode materials. For example, the first electrode 510 and the second electrode 520 may include one of gold (Au), copper (Cu), platinum (Pt), molybdenum (Mo), palladium (Pd), aluminum (Al) and combinations thereof.

An ammeter 530 may be connected to the first electrode 510 and the second electrode 520. The optical signal may pass through the light absorption layer 200 to generate an electrical signal, and the generated electrical signal may be measured by the ammeter 530.

For example, an optical signal transmitted via the optical waveguide 300 may be provided to the light absorption layer 200. In the course of passing through the light absorption layer 200, the provided optical signal is absorbed by the light absorption layer 200 to generate an electron-hole pair (EHP). The generated electrons move from the light absorption layer 200 to the second impurity region 420 containing the n-type impurity and are provided to the second electrode 520. The generated holes move from the light absorption layer 200 to the first impurity region 410 containing the p-type impurity and are provided to the first electrode 510. That is, a current may be generated from the optical signal provided to the light absorption layer 200, and the generated current may be measured by the ammeter 530.

As the intensity of the optical signal provided to the light absorption layer 200 is large, the amount of electron-hole pairs generated from the light absorption layer 200 increases. Therefore, the intensity of the optical signal passing through the light absorption layer 200 may be measured from the intensity of the current measured from the ammeter 530 between the first electrode 510 and the second electrode 520. Therefore, the photodetector structure according to some embodiments may convert the optical signal into an electrical signal.

If germanium (Ge) crystal-grown on the silicon substrate is used for the light absorption layer, the silicon substrate may be used as an optical waveguide. However, since the optical loss rate of the silicon optical waveguide is large, there is a problem that a lot of loss of the optical signal occurs before the optical signal is input to the photodetector.

In contrast, the photodetector structure 35 according to some embodiments may minimize the loss of optical signals, using another optical waveguide 300 that is in contact with the upper surface or the side surface of the light absorption layer 200. That is, since the optical waveguide 300 is separately formed on the substrate 100, it may be provided as various materials (e.g., silicon nitride) having a lower optical loss rate than silicon. Therefore, a photodetector structure with less optical loss may be provided.

Further, in the photodetector structure 35 according to some embodiments, the optical waveguide 300 may be formed on the first coating layer 110 on the substrate 100 to make contact with the light absorption layer 200. In such a case, since it is unnecessary to form another coating layer in the substrate 100, the process can be simplified.

Further, in the photodetector structure 35 according to some embodiments, the optical waveguide 300 may be formed to make contact with at least a part of the upper surface of the light absorption layer 200. In such a case, since the optical waveguide 300 may form evanescent coupling with the light absorption layer 200, the optical waveguide 300 may be formed independently of the step with the light absorption layer 200. For example, the optical waveguide 300 may be formed regardless of the height of the upper surface of the first coating layer 110. Therefore, it is possible to provide a photodetector structure capable of simplifying the process.

Figure 6:
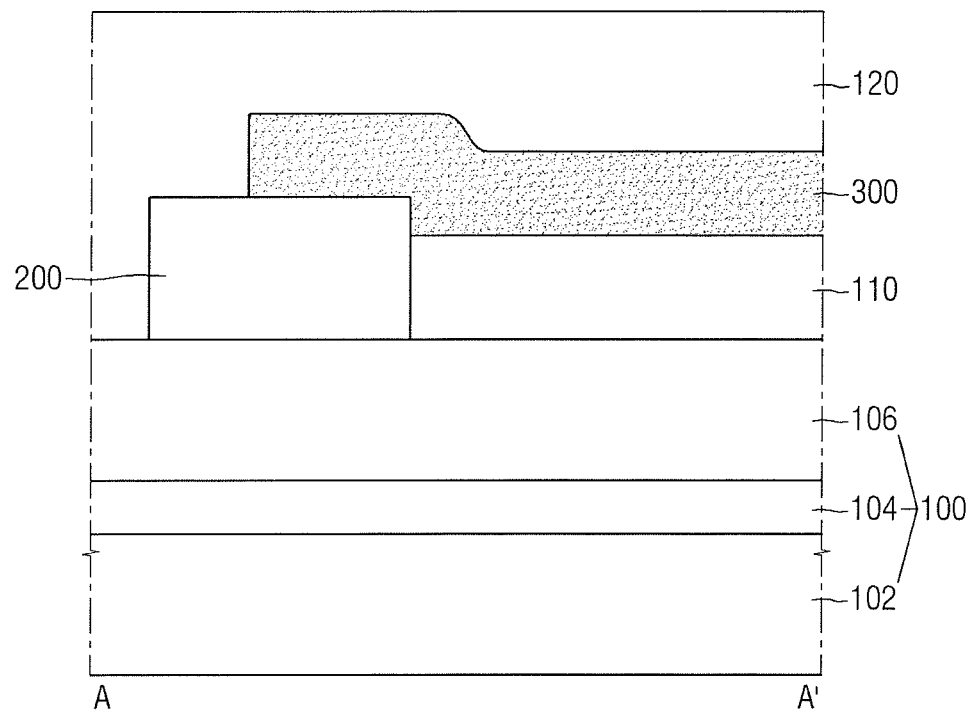
FIG. 6 illustrates a cross-sectional view of a photodetector structure according to some embodiments.

FIG. 6 is a cross-sectional view (corresponding to line A-A' of FIG. 2) illustrating a photodetector structure according to some embodiments. For convenience of explanation, elements already described with reference to FIGS. 1 to 5 will be only briefly described or omitted.

Referring to FIG. 6, in a photodetector structure according to some embodiments, the substrate 100 may include a first semiconductor film 102, a buried insulating film 104, and a second semiconductor film 106. The first semiconductor film 102, the buried insulating film 104, and the second semiconductor film 106 may be stacked in order. The buried insulating film 104 may include, e.g., buried oxide film (BOX). For example, the substrate 100 may be a silicon-on-insulator (SOI) substrate.

The light absorption layer 200 may be formed on the second semiconductor film 106 of the substrate 100. Further, the light absorption layer 200 may be in contact with the second semiconductor film 106. For example, the light absorption layer 200 may be formed by crystal growth from the upper surface of the second semiconductor film 106.

The second semiconductor film 106 may include, e.g., single crystal silicon. When the light absorption layer 200 is crystal-grown from the second semiconductor film 106 including the monocrystalline silicon, the light absorption layer 200 may include a germanium layer which is grown as a single crystal and has fewer defects.

Figure 7:
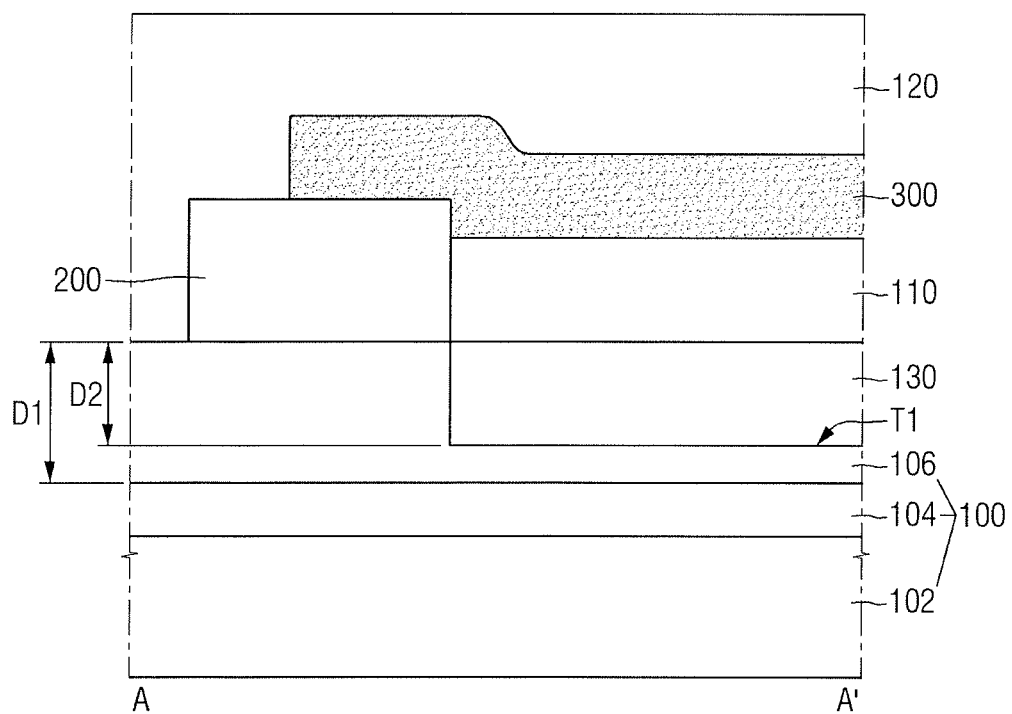
FIG. 7 illustrates a cross-sectional view of a photodetector structure according to some embodiments.

FIG. 7 is a cross-sectional view (corresponding to line A-A' of FIG. 2) illustrating a photodetector structure according to some. For convenience of explanation, elements already described with reference to FIGS. 1 to 6 will be only briefly explained or omitted.

Referring to FIG. 7, the photodetector structure according to some embodiments may further include a third coating layer 130. The third coating layer 130 may be formed in the substrate 100.

For example, the substrate 100 may include a first trench T1 therein. The third coating layer 130 may be formed to fill the first trench T1 in the substrate 100. The first trench T1 may be formed, e.g., by etching a part of the substrate 100 under the first coating layer 110. As a result, the lower surface of the third coating layer 130 may be disposed to be lower than the lower surface of the light absorption layer 200. In some embodiments, the upper surface of the third coating layer 130 may be disposed at substantially the same height as the upper surface of the substrate 100.

In FIG. 7, the depth of the first trench T1 is illustrated to be shallower than the depth at which the buried insulating film 104 is formed. Here, the "depth" means the depth from the upper surface of the substrate 100. For example, as illustrated in the drawing, the first depth D1 from the upper surface of the substrate 100 to the upper surface of the buried insulating film 104 may be greater than the second depth D2 from the upper surface of the substrate to the lower surface of the first trench T1. However, this is only for convenience of explanation, and the present disclosure is not limited thereto. For example, the first depth D1 at which the buried insulating film 104 is formed may be smaller than or equal to the second depth D2 of the first trench T1.

The third coating layer 130 may include, but is not limited to, e.g., silicon oxide. In addition, the third coating layer 130 may be formed by, e.g., a vapor deposition process, but is not limited thereto. The first coating layer 110, the second coating layer 120, and the third coating layer 130 may include the same material or different materials.

The coating formed by the first coating layer 110 and the third coating layer 130 may constitute a lower coating layer under the optical waveguide 300. In the photodetector structure according to some embodiments, the thickness of the third coating layer 130 in the substrate 100 may be adjusted as required. For example, by adjusting the depth of the first trench T1, the thickness of the third coating layer 130 may be adjusted. Therefore, the thickness of the lower coating layer formed by the first coating layer 110 and the third coating layer 130 may be adjusted.

Figure 8:
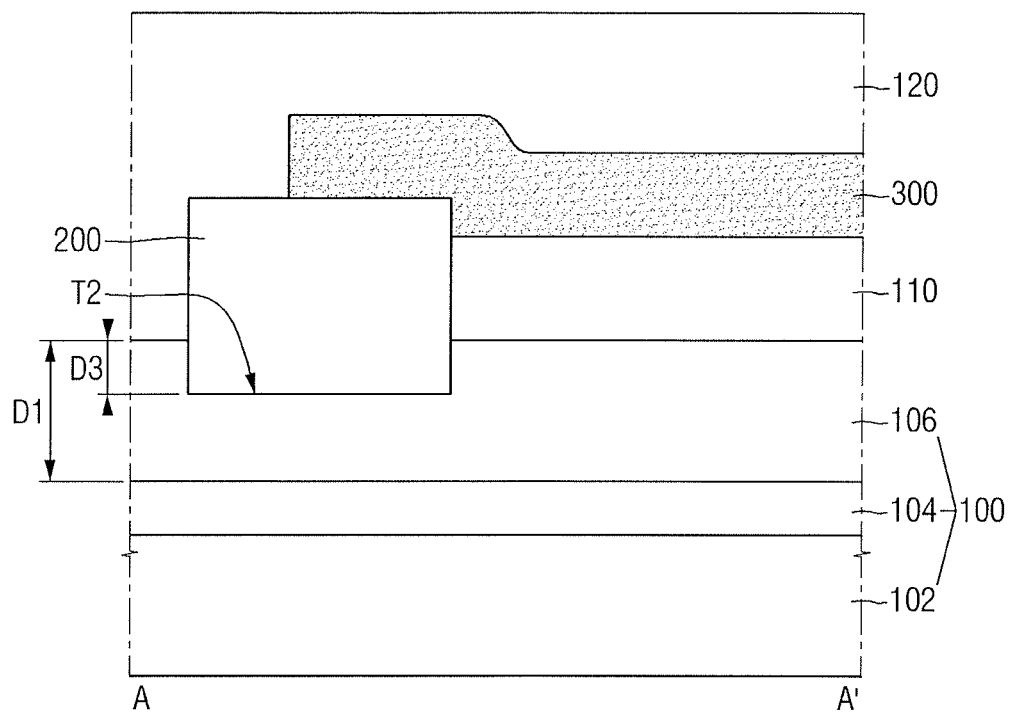
FIG. 8 illustrates a cross-sectional view of a photodetector structure according to some embodiments.

FIG. 8 is a cross-sectional view (corresponding to line A-A' of FIG. 2) illustrating a photodetector structure according to some embodiments. For convenience of explanation, elements already described with reference to FIGS. 1 to 6 will be only briefly explained or omitted.

Referring to FIG. 8, in the photodetector structure according to some embodiments, the lower surface of the light absorption layer 200 is formed to be lower than the upper surface of substrate 100.

A part of the light absorption layer 200 may be formed in the substrate 100. For example, the second semiconductor film 106 may include a second trench T2 therein. Further, the lower part of the light absorption layer 200 may be formed to fill the second trench T2 in the second semiconductor film 106. The second trench T2 may be formed, e.g., by etching a part of the second semiconductor film 106 under the light absorption layer 200.

In some embodiments, the first coating layer 110 may be formed on the uppermost surface the substrate 100. For example, the first coating layer 110 may be in contact with the uppermost surface of the second semiconductor film 106. As a result, the lower surface of the first coating layer 110 may be disposed to be higher than the lower surface of the light absorption layer 200.

In some embodiments, the depth of the second trench T2 may be shallower than the depth at which the buried insulating film 104 is formed. Here, the "depth" means the depth from the upper surface of the substrate 100. For example, the first depth D1 from the upper surface of the substrate 100 to the upper surface of the buried insulating film 104 may be greater than the third depth D3 from the upper surface of the substrate 100 to the lower surface of the second trench T2. In some embodiments, the light absorption layer 200 may be formed by crystal growth from the second semiconductor film 106 including the second trench T2.

Figure 9:
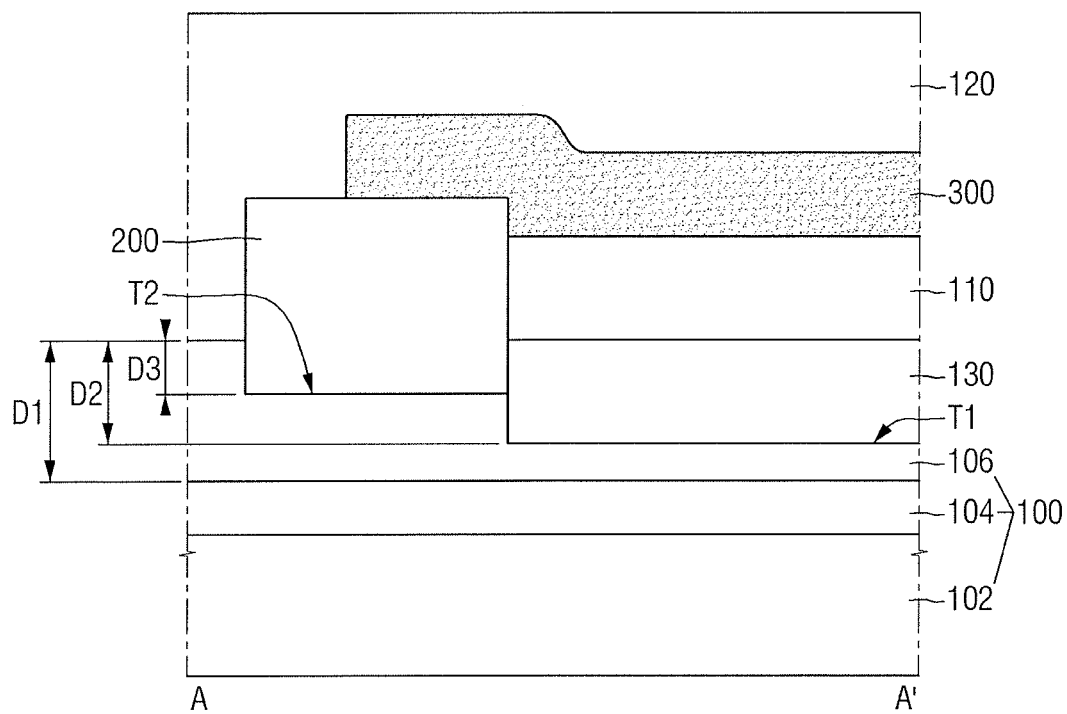
FIG. 9 illustrates a cross-sectional view of a photodetector structure according to some embodiments.

FIG. 9 is a cross-sectional view (corresponding to line A-A' of FIG. 2) illustrating the photodetector structure according to some. For convenience of explanation, elements already described with reference to FIGS. 1 to 8 will be only briefly explained or omitted.

Referring to FIG. 9, a photodetector structure according to some embodiments may include the third coating layer 130 which fills the first trench T1, and the light absorption layer 200 which fills the second trench T2.

In FIG. 9, the depth of the second trench T2 is illustrated as being shallower than the depth of the first trench T1. Here, the "depth" means the depth from the upper surface of the substrate 100. For example, as illustrated, the second depth D2 from the upper surface of the substrate 100 to the lower surface the first trench T1 may be greater than the third depth D3 from the upper surface of the substrate 100 to the lower surface of the second trench T2.

However, this is only for convenience of explanation, and the present disclosure is not limited thereto. For example, the second depth D2 of the first trench T1 may be smaller than or equal to the third depth D3 of the second trench T2. In some embodiments, the third depth D3 of the second trench T2 may be shallower than the first depth D1 at which the buried insulating film 104 is formed.

Figure 10:
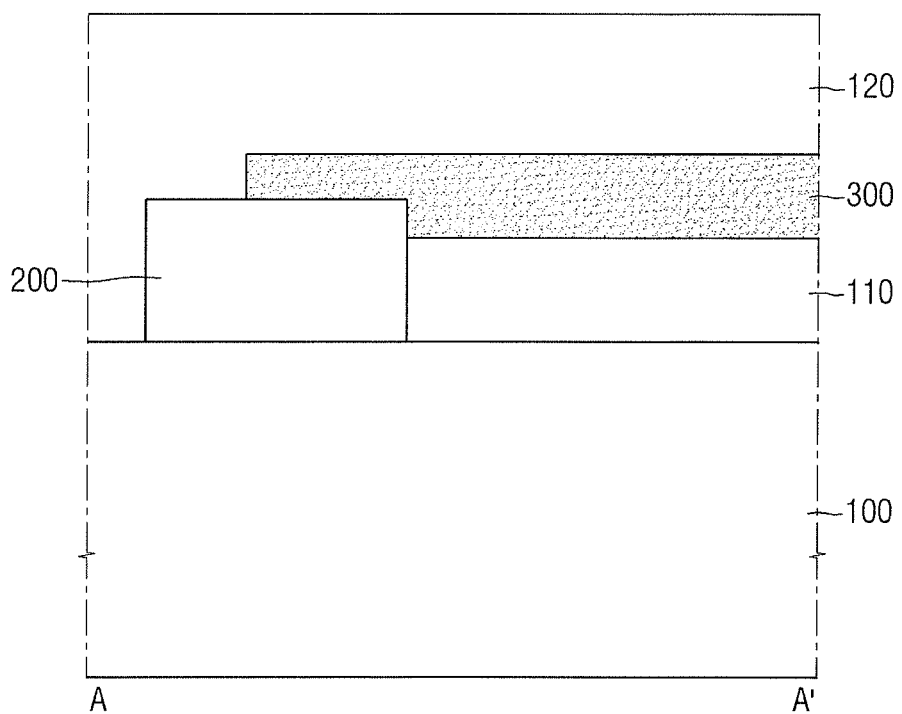
FIG. 10 illustrates a cross-sectional view of a photodetector structure according to some embodiments.

FIG. 10 is a cross-sectional view (corresponding to line A-A' of FIG. 2) illustrating the photodetector structure according to some embodiments. For convenience of explanation, elements already described with reference to FIGS. 1 to 5 will be only briefly described or omitted.

Referring to FIG. 10, in the photodetector structure according to some embodiments, an upper surface 300b of the optical waveguide 300 may be substantially flat.

The optical waveguide 300 may be in contact with the light absorption layer 200. For example, as illustrated in FIG. 10, the optical waveguide 300 may be in contact with at least a part of the upper surface of the light absorption layer 200 and a part of the side surface of the light absorption layer 200. However, the upper surface 300b of the optical waveguide 300 may be substantially flat.

The upper surface 300b of the optical waveguide 300 may be planarized by, e.g., a planarization process. The planarization process may include, but is not limited to, e.g., a chemical mechanical polishing (CMP) process.

Figure 11:
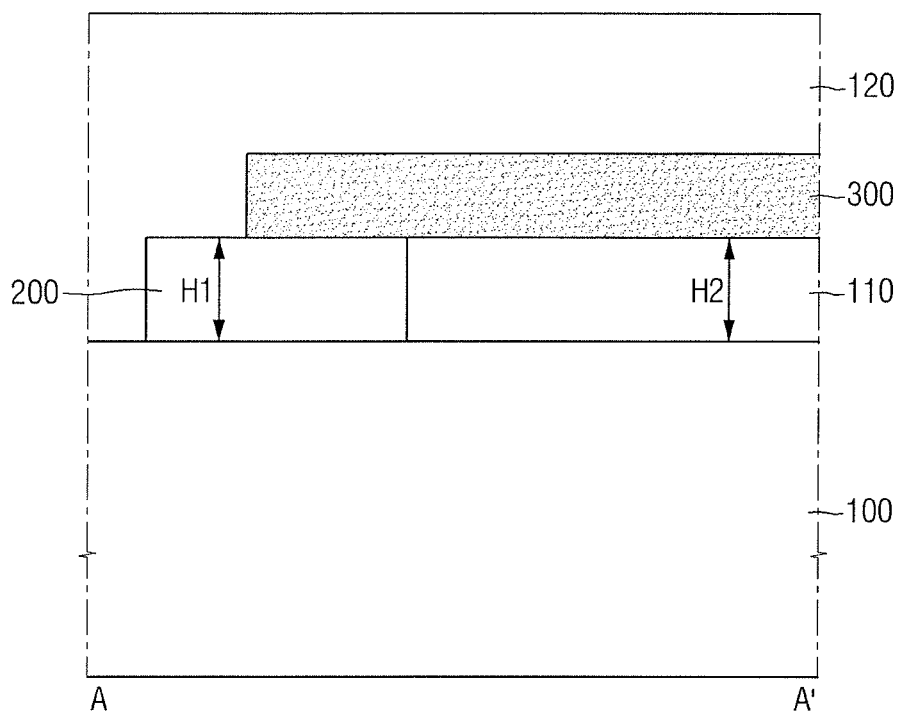
FIG. 11 illustrates a cross-sectional view of a photodetector structure according to some embodiments.

FIG. 11 is a cross-sectional view (corresponding to line A-A' of FIG. 2) illustrating the photodetector structure according to some embodiments. For convenience of explanation, elements already described with reference to FIGS. 1 to 5 will be only briefly described or omitted.

Referring to FIG. 11, in the photodetector structure according to some embodiments, the optical waveguide 300 may be in contact with at least a part of the upper surface of the light absorption layer 200.

For example, the height of the light absorption layer 200 may be substantially the same as the height of the first coating layer 110. Here, the "height" means the height from the upper surface of the substrate 100. For example, as illustrated in FIG. 11, a first height H1 from the upper surface of the substrate 100 to the upper surface of the light absorption layer 200 may be substantially the same as the second height H2 from the upper surface of the substrate 100 to the upper surface of the first coating layer 110. In the present specification, "the same" means not only completely the same thing but also a fine difference which may occur due to a process margin or the like.

Since the optical waveguide 300 may be formed on the first coating layer 110, the height of the upper surface of the light absorption layer 200 may be substantially the same as the height of the lower surface of the optical waveguide 300. Therefore, the optical waveguide 300 may make contact with at least a part of the upper surface of the light absorption layer 200 to form the evanescent coupling with the light absorption layer 200.

In some embodiments, the upper surface of the light absorption layer 200 and the upper surface of the first coating layer 110 may be planarized, e.g., by a planarization process. The planarization process may include, but is not limited to, e.g., a chemical mechanical polishing (CMP) process.

Figure 12:
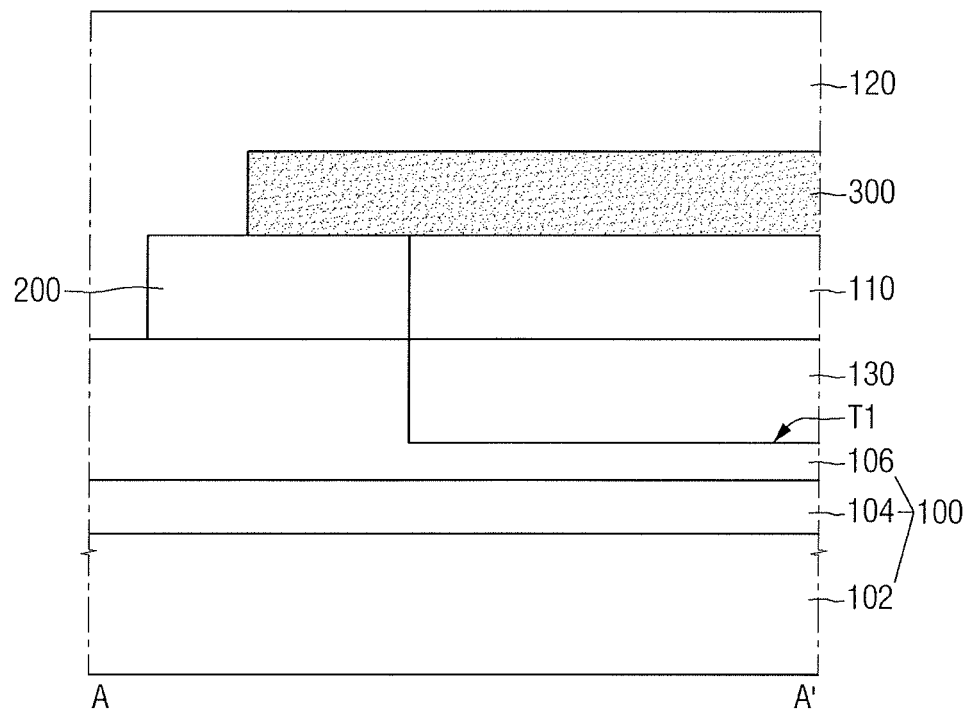
FIG. 12 illustrates a cross-sectional view of a photodetector structure according to some embodiments.

FIG. 12 is a cross-sectional view (corresponding to line A-A' of FIG. 2) illustrating a photodetector structure according to some embodiments. For the sake of convenience of explanation, elements already explained with reference to FIGS. 1 to 5, 7 and 11 will be only briefly explained or omitted.

Referring to FIG. 12, in the photodetector structure according to some embodiments, the substrate 100 may include the first semiconductor film 102, the buried insulating film 104, and the second semiconductor film 106. Also, the photodetector structure according to some embodiments may further include the third coating layer 130.

The first semiconductor film 102, the buried insulating film 104, and the second semiconductor film 106 may be stacked in order. The buried insulating film 104 may include, e.g., buried oxide (BOX). For example, the substrate 100 may be a silicon-on-insulator (SOI) substrate.

The third coating layer 130 may be formed in the substrate 100. For example, the substrate 100 may include the first trench T1 therein. The third coating layer 130 may be formed to fill the first trench T1 in the substrate 100. The first trench T1 may be formed, e.g., by etching a part of the substrate 100 under the first coating layer 110.

Figure 13:
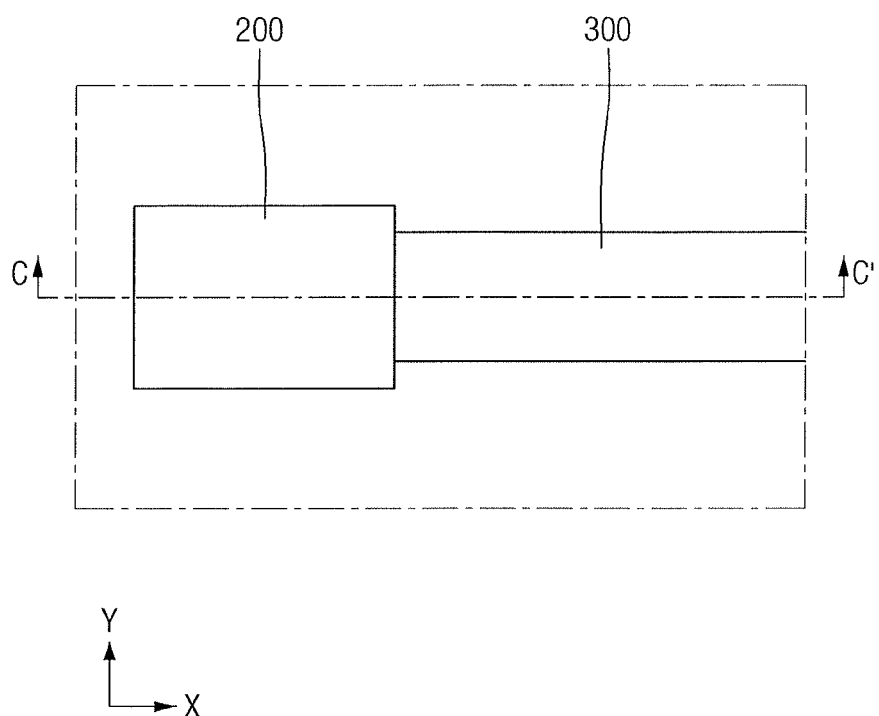
FIG. 13 illustrates a layout diagram of a photodetector structure according to some embodiments.
Figure 14:
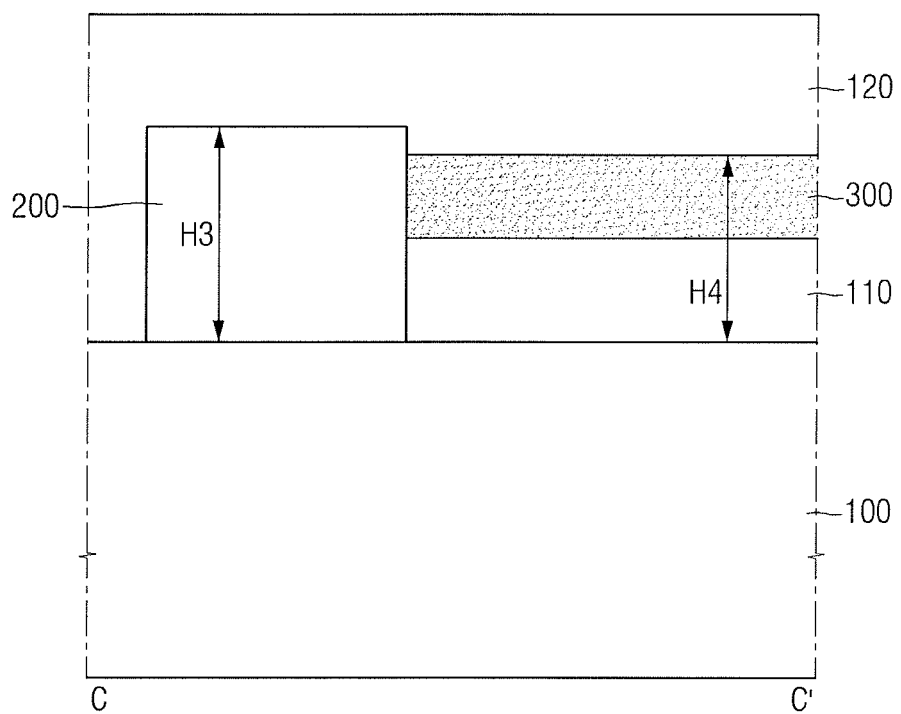
FIGS. 14 and 15 illustrate various cross-sectional views along line C-C' of FIG. 13.
Figure 15:
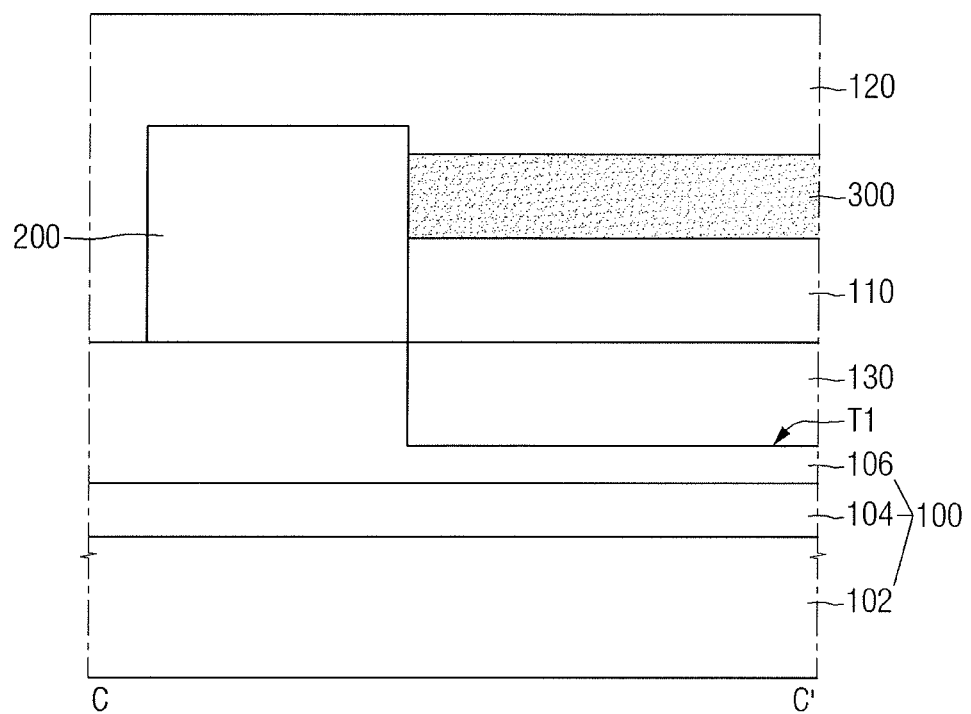

FIG. 13 is a layout diagram of the photodetector structure according to some embodiments. FIGS. 14 and 15 are various cross-sectional views along line C-C' of FIG. 13. For convenience of explanation, elements already described with reference to FIGS. 1 to 5 and 7 will be only briefly explained or omitted.

Referring to FIGS. 13 and 14, in the photodetector structure according to some embodiments, the optical waveguide 300 may be in contact with a part of the side surface of the light absorption layer 200.

For example, the height of the light absorption layer 200 may be higher or equal to the height of the optical waveguide 300. Here, the "height" means the height from the upper surface of the substrate 100. For example, as illustrated, the third height H3 from the upper surface of the substrate 100 to the upper surface of the light absorption layer 200 may be higher than or equal to the fourth height H4 from the upper surface of the substrate 100 to the upper surface of the optical waveguide 300.

However, since the optical waveguide 300 may be formed on the first coating layer 110, the lower surface of the optical waveguide 300 may be disposed to be higher than the lower surface of the light absorption layer 200. As a result, the optical waveguide 300 makes contact with a part of the side surface of the light absorption layer 200 to form the butt coupling with the light absorption layer 200.

Referring to FIG. 15, in the photodetector structure according to some embodiments, the substrate 100 may include the first semiconductor film 102, the buried insulating film 104, and the second semiconductor film 106. Also, the photodetector structure according to some embodiments may further include the third coating layer 130.

The first semiconductor film 102, the buried insulating film 104, and the second semiconductor film 106 may be stacked in order. The buried insulating film 104 may include, e.g., buried oxide film (BOX). For example, the substrate 100 may be a silicon-on-insulator (SOI) substrate.

The third coating layer 130 may be formed in the substrate 100. For example, the substrate 100 may include the first trench T1 therein. The third coating layer 130 may be formed to fill the first trench T1 in the substrate 100. The first trench T1 may be formed, e.g., by etching a part of the substrate 100 under the first coating layer 110.

Figure 16:
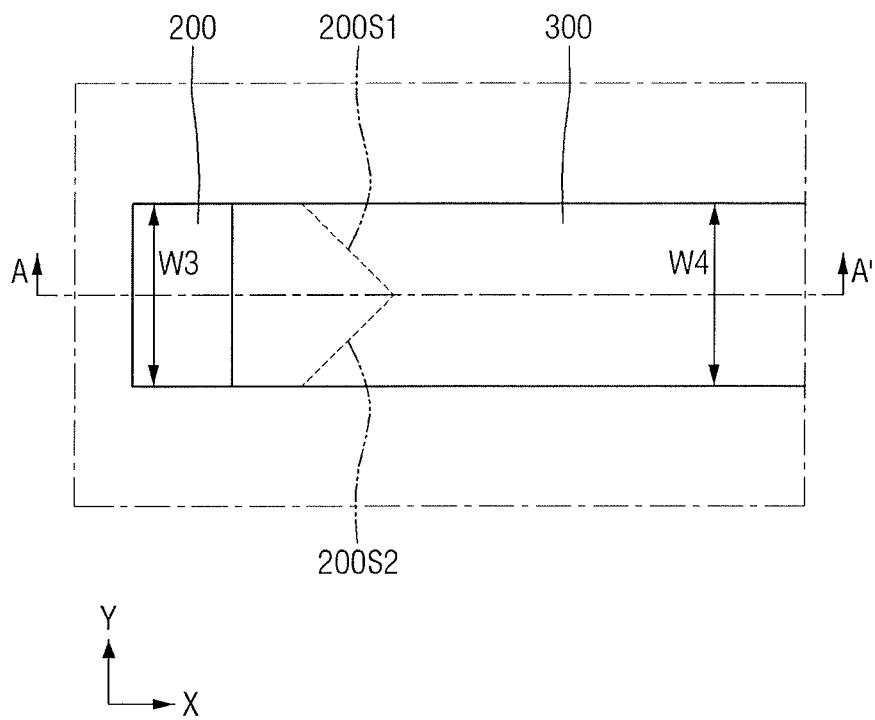
FIG. 16 illustrates a layout diagram of a photodetector structure according to some embodiments.

FIG. 16 is a layout diagram of a photodetector structure according to some embodiments. For convenience of explanation, elements already described with reference to FIGS. 1 to 5 will be only briefly described or omitted. For reference, since the cross-sectional view taken along the line A-A' of FIG. 16 is substantially the same as FIGS. 3 and 6 to 12, detailed description thereof will not be provided below.

Referring to FIG. 16, in the photodetector structure according to some embodiments, the side surface of the light absorption layer 200 may include a first side surface 200S1 and a second side surface 200S2.

The first side surface 200S1 and the second side surface 200S2 of the light absorption layer 200 may extend in directions different from the first direction X and the second direction Y. In addition, the first side surface 200S1 and the second side surface 200S2 of the light absorption layer 200 may extend to meet each other. For example, the first side surface 200S1 of the light absorption layer 200 may extend inward from one side surface of the light absorption layer 200. Further, the second side surface 200S2 of the light absorption layer 200 may extend inward from the other side surface of the light absorption layer 200 to meet the first side surface 200S1 of the light absorption layer 200. Therefore, the optical waveguide 300 is in contact with the first side surface 200S1 and the second side surface 200S2 of the light absorption layer 200 to form the butt coupling with the light absorption layer 200.

In FIG. 16, the width of the light absorption layer 200 is illustrated to be the same as the width of the optical waveguide 300. Here, the "width" means the width in the second direction Y. For example, as illustrated, the third width W3 of the light absorption layer 200 may be the same as the fourth width W4 of the optical waveguide 300. However, this is only for convenience of explanation, and the present disclosure is not limited thereto. For example, the third width W3 of the light absorption layer 200 may be larger or narrower than the fourth width W4 of the optical waveguide 300.

Figure 17:
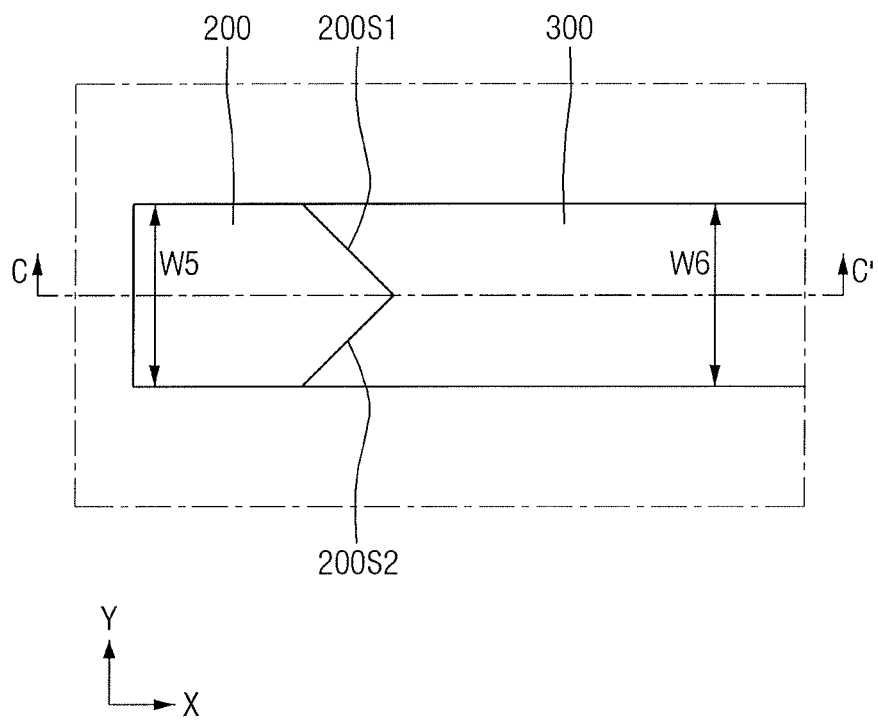
FIG. 17 illustrates a layout diagram of a photodetector structure according to some embodiments.

FIG. 17 is a layout diagram of the photodetector structure according to some embodiments. For convenience of explanation, elements already described with reference to FIGS. 1 to 5 and 16 are only briefly explained or omitted. For the sake of reference, since the cross-sectional view taken along the line C-C' of FIG. 17 is substantially the same as FIGS. 14 and 15, the detailed description thereof will not be provided below.

Referring to FIG. 17, in the photodetector structure according to some embodiments, the side surface of the light absorption layer 200 may include the first side surface 200S1 and the second side surface 200S2. The first side surface 200S1 and the second side surface 200S2 of the light absorption layer 200 may extend in directions different from the first direction X and the second direction Y. Further, the first side surface 200S1 and the second side surface 200S2 of the light absorption layer 200 may extend to meet each other. Therefore, the optical waveguide 300 is brought into contact with the first side surface 200S1 and the second side surface 200S2 of the light absorption layer 200 to form the butt coupling with the light absorption layer 200.

In FIG. 17, the width of the light absorption layer 200 is illustrated to be the same as the width of the optical waveguide 300. Here, the "width" means the width in the second direction Y. For example, as illustrated, the fifth width W5 of the light absorption layer 200 may be the same as the sixth width W6 of the optical waveguide 300. However, this is only for convenience of explanation, and the present disclosure is not limited thereto. For example, the fifth width W5 of the light absorption layer 200 may be wider or narrower than the sixth width W6 of the optical waveguide 300.

By way of summation and review, an optical waveguide of a photodetector may be formed of a silicon substrate and may transmit an optical signal. However, since an optical loss rate of the silicon optical waveguide is large, a large loss of optical signal may occur before being input to the photodetector.

In contrast, the present disclosure provides a photodetector structure which has less optical loss and enables a process simplification. That is, a photodetector according to embodiments may minimize the loss of optical signals, using an optical waveguide that is separately formed on the substrate. The optical waveguide may be formed of a material having a lower optical loss rate than silicon, e.g., silicon nitride.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photodetector structure, comprising:
   a substrate including a semiconductor film;
   a light absorption layer on the substrate, the light absorption layer being in contact with the semiconductor film and including germanium (Ge), the light absorption layer being an epitaxial layer crystal-grown from an upper surface of the semiconductor film;
   a first coating layer on the substrate, the first coating layer wrapping at least a part of a side surface of the light absorption layer; and
   an optical waveguide on the first coating layer, the optical waveguide being in contact with the light absorption layer and including silicon nitride (SiN),
   wherein a lower surface of the optical waveguide is higher than a lower surface of the light absorption layer, and
   wherein the optical waveguide extends on an upper surface of the first coating layer to contact the side surface of the light absorption layer and an upper surface of the light absorption layer.

2. The photodetector structure as claimed in claim 1, wherein the light absorption layer and the first coating layer are in contact with an uppermost surface of the semiconductor film.

3. The photodetector structure as claimed in claim 1, wherein the optical waveguide is in contact with at least a part of the side surface and at least a part of an upper surface of the light absorption layer.

4. The photodetector structure as claimed in claim 1, wherein a lower part of the light absorption layer fills a trench in the substrate.

5. The photodetector structure as claimed in claim 1, further comprising a second coating layer under the first coating layer, the second coating layer filling a trench in the substrate.

6. The photodetector structure as claimed in claim 1, further comprising a second coating layer on the substrate, the second coating layer covering the light absorption layer, the first coating layer, and the optical waveguide.

7. The photodetector structure as claimed in claim 6, wherein the second coating layer directly contacts at least the light absorption layer, the optical waveguide, and the substrate.

8. The photodetector structure as claimed in claim 7, wherein the optical waveguide extends directly between the first and second coating layers.

9. The photodetector structure as claimed in claim 1, wherein the substrate is an SOI (Silicon-On-Insulator).

10. The photodetector structure as claimed in claim 1, wherein the first coating layer includes silicon oxide.

11. The photodetector structure as claimed in claim 1, wherein the optical waveguide extends in a direction parallel to an upper surface of the substrate.

12. The photodetector structure as claimed in claim 1, wherein the light absorption layer includes:
    a first impurity region of a first conductivity type;
    a second impurity region of a second conductivity type different from the first conductivity type; and
    a germanium layer between the first impurity region and the second impurity region.

13. The photodetector structure as claimed in claim 1, wherein a lower surface of the first coating layer and the lower surface of the light absorption layer are coplanar.

14. The photodetector structure as claimed in claim 1, wherein the light absorption layer is thicker than the first coating layer along a direction normal to the bottom of the substrate.

15. The photodetector structure as claimed in claim 14, wherein the light absorption layer extends above the first coating layer relative to the bottom of the substrate.

16. The photodetector structure as claimed in claim 1, wherein the light absorption layer covers an entirety of a side surface of the first coating layer, the lower surfaces of the light absorption layer and the optical waveguide facing the substrate and being perpendicular to the side surfaces of the first coating layer and the light absorption layer.

* * * * *